(12) United States Patent
Den Besten

(10) Patent No.: US 6,480,048 B2
(45) Date of Patent: Nov. 12, 2002

(54) CIRCUIT FOR GENERATING AN INVERSE SIGNAL OF A DIGITAL SIGNAL WITH A MINIMAL DELAY DIFFERENCE BETWEEN THE INVERSE SIGNAL AND THE DIGITAL SIGNAL

(75) Inventor: Gerrit Willem Den Besten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/902,218

(22) Filed: Jul. 10, 2001

(65) Prior Publication Data

US 2002/0012413 A1 Jan. 31, 2002

(30) Foreign Application Priority Data

Jul. 10, 2000 (EP) ............................................. 00202450

(51) Int. Cl.[7] .............................................. H03H 11/16
(52) U.S. Cl. ........................ 327/239; 327/257; 327/259; 327/262; 327/288; 327/295
(58) Field of Search ......................... 327/239, 256–259, 327/295, 108, 112, 161, 261, 264, 269, 272, 288, 285, 170, 165, 262; 326/83

(56) References Cited

U.S. PATENT DOCUMENTS 5,341,048 A * 8/1994 Randhawa et al. ......... 327/256
5,541,532 A * 7/1996 McCall ........................ 326/83
5,867,043 A * 2/1999 Kim ............................ 327/257
6,225,847 B1 * 5/2001 Kim ............................ 327/257

FOREIGN PATENT DOCUMENTS

DE 4315298 C1 8/1994

* cited by examiner

Primary Examiner—Terry D. Cunningham
Assistant Examiner—Long Nguyen
(74) Attorney, Agent, or Firm—Steven R. Biren

(57) ABSTRACT

Circuit for generating an inverse signal of a digital signal with minimal delay difference between the inverse signal and the digital signal. Two inverter circuits (6, 8; 7, 9) have been connected in series. The output signal of the second inverter circuit (7, 9) is the digital signal. An input signal for the first inverter circuit (6, 8) is supplied to a pass-through circuit (13, 14) with threshold action. The signal present between the first (6, 8) and the second (7, 9) inverter circuit is supplied to a control input (16) of the pass-through circuit with threshold action. The signal which is also present between the first (6, 8) and the second (7, 9) inverters appears with some delay at the output (17) of the pass-through circuit with threshold action, which signal is the inverse of the digital signal and at the same time constitutes the output signal of the pass through circuit (13, 14) with threshold action.

2 Claims, 2 Drawing Sheets

CIRCUIT FOR GENERATING AN INVERSE SIGNAL OF A DIGITAL SIGNAL WITH A MINIMAL DELAY DIFFERENCE BETWEEN THE INVERSE SIGNAL AND THE DIGITAL SIGNAL

The invention relates to a circuit for generating an inverse signal of a digital signal with a minimal delay difference between the inverse signal and the digital signal.

Such a circuit is known from German patent document 43 15 298. The circuit described therein requires an inverter with an additional clock circuit whose frequency must be related to the frequency of the signal to be inverted. The clock signal determines the tempo in which and the moments at which the edges of the digital signal and the inverted signal are synchronized by means of the circuit disclosed. A digital signal having edges at moments not related to the edges of the clock signal cannot be inverted with the circuit under discussion in such a manner that the edges, and possibly the steepnesses thereof, of the digital signal and the inverted signal are representative of the original signal.

Timing may be highly critical in circuits on occasions in the sense that a signal must be available in the normal as well as the inverse form simultaneously, such that no delay obtains between the edges of the two signals. That is to say, the edges of the two signals must exactly coincide in time.

If there are two signal paths, the digital signal having to follow the one signal path and the inverted digital signal having to follow the other signal path, the simplest manner of generating said signals is to include one more inverter in one of the two paths. It is known that this results in unequal delays, i.e. an additional gate delay of the inverter, so that the edges of the digital signal and the inverse signal no longer coincide.

It is also known to include a so-called pass gate in the signal path in which the signal is present for the shortest period as compared with the other signal path, with the purpose of compensating to a certain extent the difference in delay caused by the additional inverter. A difference does remain, however, because the manners in which the delays are created are dissimilar. The idle time which arises in an inverter as a result of charging/discharging of the input across a threshold voltage is not present in the pass gate.

It is an object of the invention to provide a circuit in which the disadvantages detailed above have been largely or wholly eliminated.

According to the invention, such a circuit is for this purpose characterized in that a first and a second inverter circuit are connected in series, in that an input of the first inverter circuit forms the input of the circuit, in that an output of the second inverter circuit forms a first output of the circuit for supplying the digital signal, in that the input of the first inverter circuit is connected to an adjustment input of a pass-through circuit with threshold action, in that a junction point, at which an output of the first inverter circuit is connected to an input of the second inverter circuit, is connected to a control input of the pass-through circuit with threshold action, which pass-through circuit with threshold action supplies a signal at an output thereof equal to the signal at the junction point and having a delay which is substantially equal to the delay introduced by the second inverter circuit, said output of the pass-through circuit with threshold action forming a second output of the circuit for supplying the inverse signal.

It is achieved thereby that the edges of the digital signal and of the inverse signal are made to coincide substantially by means of a simple circuit. It is also achieved that the operation of the circuit is independent of an additional clock signal as described in German patent document 43 15 298.

A preferred embodiment of a circuit according to the invention is characterized in that the first and the second inverter are built up from MOS-FETs, and in that the pass-through circuit with threshold action comprises an N-type and a P-type MOS-FET whose gates are interconnected and form the adjustment input of the pass-through circuit with threshold action, whose sources are interconnected and form the control input of the pass-through circuit with threshold action, and whose drains are interconnected and form the output of the pass-through circuit with threshold action.

The operation with MOS-FETs achieves that a very accurate circuit can be designed and manufactured in a simple manner, in which the various delays in the individual circuit components can be determined beforehand and can be satisfactorily maintained during production.

The invention will now be explained in more detail below with reference to he accompanying drawings, in which:

FIG. 1 shows the circuit with a supply voltage+Vcc and ground connection 1.

Figure 1:
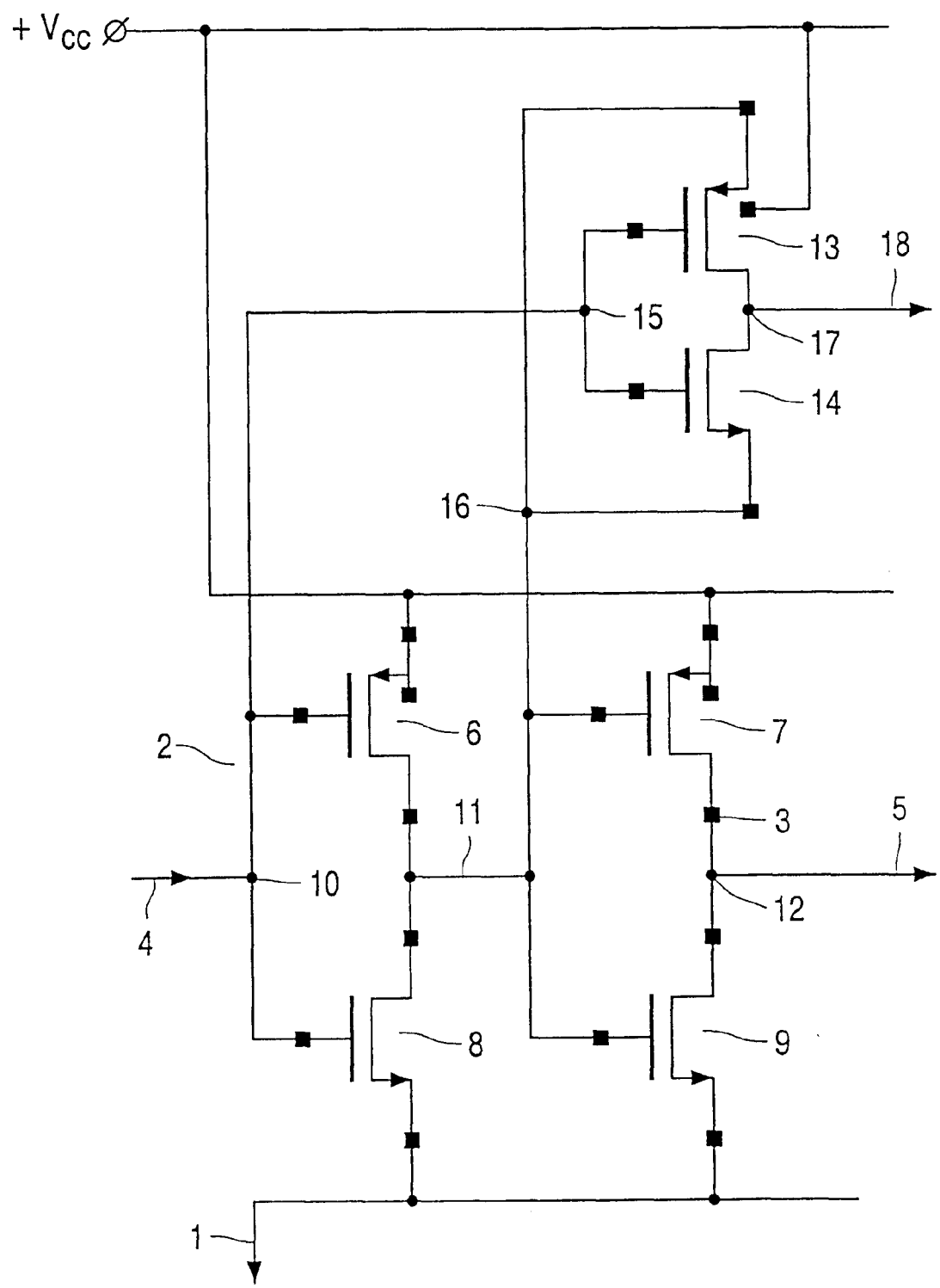
FIG. 1 shows a circuit according to the invention.

A first inverter 2 and a second inverter 3 are connected in series between an input 4 of the circuit and a first output 5 of the circuit. The inverters 2 and 3 each comprise a P-type MOS-FET 6 and 7, respectively, whose sources are connected to the supply voltage+Vcc, whose gates are connected to the gates of respective N-type MOS-FETs 8 and 9, the sources of said N-type MOS-FETs being connected to ground 1. The drains both of the P-type MOSFET 6 and the N-type MOS-FET 8, and those of the P-type MOS-FET 7 and N-type MOS-FET 9 are interconnected. The input 4 of the circuit is connected to a junction point 10 of the gates of the P-type MOS-FET 6 and the N-type MOS-FET 8. A junction point 11 is formed by the interconnection of the drain of the P-type MOS-FET 6, the drain of the N-type MOS-FET 8, the gate of the P-type MOS-FET 7, and the gate of the N-type MOS-FET 9. A junction point 12 of the drains of the P-type MOS-FET 7 and the N-type MOS-FET 9 is connected to the first output 5. The circuit further comprises a P-type MOS-FET 13 and an N-type MOS-FET 14. The gate of the P-type MOS-FET 13 is connected to the gate of the N-type MOS-FET 14 in a junction point 15. Said junction point 15 is connected to the junction point 10. The source of the P-type MOS-FET 13 is connected to the source of the N-type MOS-FET 14 in a junction point 16. Said junction point 16 is connected to the junction point 11. The drain of the P-type MOS-FET 13 is connected to the drain of the N-type MOS-FET 14 in a junction point 17. Said junction point 17 is connected to a second input 18 of the circuit. The substrate of the P-type MOS-FET 13 is connected to the supply voltage+Vcc and is not connected to the source of the P-type MOS-FET 13. It is not indicated for the sake of clarity that the substrate of the N-type MOS-FET 14 is connected to ground 1.

The operation of the circuit of FIG. 1 is as follows. Let us suppose that the signal at the input 4 of the circuit switches from low to high. This has the result that the potential at the junction points 10 and 15 becomes high. The fact that the potential at the junction point 15 becomes high switches the P-type MOS-FET 13 off and switches the N-type MOS-FET 14 on. This, however, does not yet have any consequences for the signal at junction point 17 and output 18. The potential at the junction point 11 switches from high to low with a delay determined by the P-type MOS-FET 6 and the N-type MOS-FET 8. The switch from high to low of the potential at the junction point 11 has two consequences. The first consequence relates to the inverter 3. The potential at the junction point 12, and thus at the first output 5 of the circuit, becomes high with a delay determined by the P-type MOS-FET 7 and the N-type MOS-FET 9. The switch from high to low of the potential at the junction point 11, and accordingly at the junction point 16, has a consequence for the circuit formed by the P-type MOS-FET 13 and N-type MOS-FET 14, i.e. that the potential at the junction point 17, and accordingly at the second output 18 of the circuit, drops in accordance with the switching-off of the P-type MOS-FET 13 and the switching-on of the N-type MOSFET 14. It should be borne in mind here that both the switch from low to high of the potential at the junction point 12 and the switch from high to low of the potential at the junction point 17 do not take place until the moment the potential at the junction point 11/16 has dropped to below a threshold value. It should be noted that the gate-source voltages of the N-type MOSFET 14 and the P-type MOS-FET 7 remain unchanged during this process.

If the potential at the input 4 switches from high to low, the operation of the circuit is exactly the same, with the proviso that in this case the P-type MOS-FET 13 is switched on and the N-type MOS-FET 14 is switched off, and that the potential transition at the junction points 12 and 17 takes place, simultaneously again, when the potential at the junction point 11/16 rises to above the threshold value of the P-type MOS-FET 13 and the N-type MOS-FET 9.

The P-type MOS-FET 13 and the N-type MOS-FET 14 show a threshold characteristic when passing on the signal at junction point 16, as was described above. The circuit formed by the MOS-FETs 13 and 14 accordingly forms a pass-through circuit with threshold action with a first input, i.e. junction point 15, and a second input, i.e. junction point 16, and an output, i.e. junction point 17.

Figure 2:
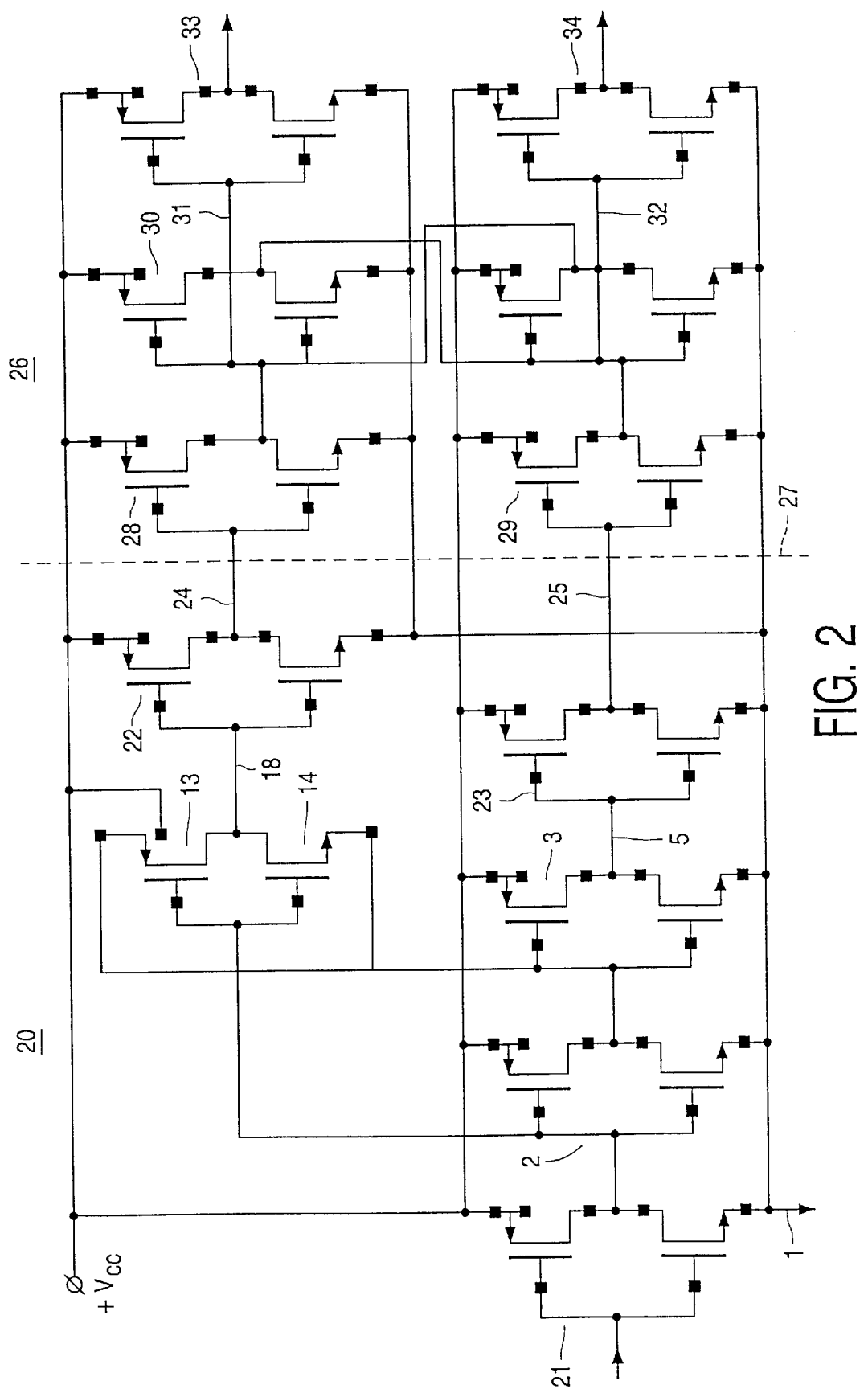
FIG. 2 shows an application of a circuit according to the invention in a wider environment for controlling greater loads.

FIG. 2 shows an application of the circuit of FIG. 1 in which greater loads can be controlled than with the circuit of FIG. 1. Not all components have been separately identified in FIG. 2, instead, they have been grouped together in a known manner. The inverters 2 and 3 and the P-type MOS-FET 13 and N-type MOS-FET 14 are recognizable in FIG. 2, as are the interconnections thereof as described in more detail with reference to FIG. 1. An inverter 21 is shown as a buffer at the input of the circuit 20 in FIG. 2. An inverter 22 acting as a buffer at the output 18 and an inverter 23 acting as a buffer at the output 5 have been provided. The buffers 22 and 23 ensure that a digital signal and an inverted signal are present again at the outputs 24 and 25, respectively, such that the edges of said signals substantially coincide. The buffers 22 and 23 are dimensioned such that greater loads can be controlled than is possible with the signals present at the outputs 5 and 18. Inverters 28 and 29 acting as buffers are provided in the circuit portion 26 of the circuit 20 situated on the right of the broken line 27 for providing a possibility of controlling even greater loads and at the same time further enhancing the synchronicity of the edges of the signals present at the outputs 5 and 18 and the outputs 25 and 24, respectively. A latch circuit 30 is connected to the inverters 28 and 29, and outputs 31 and 32 of the latch circuit 30 are buffered by inverters 33 and 34.

The operation of the circuit 20 of FIG. 2 was described above with reference to FIG. 1 as regards the creation of the digital signal at the output 5 and the inverted signal at the output 18. It is assumed for the operation of the circuit portion 26 that it comprises sub-circuits known to those skilled in the art, such as inverters and latch circuits which are shown here merely for indicating that greater loads can be controlled, while it is known that a latch circuit 30 does not impair the synchronicity of the edges of the signals coming from the outputs 24 and 25; indeed, it tends to improve it, in as far as this is still possible.

What is claimed is:

1. A circuit for generating an inverse signal of a digital signal with a minimal delay difference between the inverse signal and the digital signal, characterized in that a first (6, 8) and a second (7, 9) inverter circuit are connected in series, in that an input (10) of the first inverter circuit (6, 8) forms the input (4) of the circuit, in that an output (12) of the second inverter circuit (7, 9) forms a first output (5) of the circuit for supplying the digital signal, in that the input (10) of the first inverter circuit (6, 8) is connected to an adjustment input (15) of a pass-through circuit (13, 14) with threshold action, in that a junction point (11), at which an output of the first inverter circuit (6, 8) is connected to an input of the second inverter circuit (7, 9), is connected to a control input (16) of the pass-through circuit (13, 14) with threshold action, which pass-through circuit (13, 14) with threshold action supplies a signal at an output (17) thereof equal to the signal at the junction point (11) and having a delay which is substantially equal to the delay introduced by the second inverter circuit (7, 9), said output (17) of the pass-through circuit (13, 14) with threshold action forming a second output (18) of the circuit for supplying the inverse signal.

2. A circuit as claimed in claim 1, characterized in that the first (6, 8) and the second (7, 9) inverter are built up from MOS-FETs, and in that the pass-through circuit (13, 14) with threshold action comprises a P-type and an N-type MOS-FET whose gates are interconnected and form the adjustment input (15) of the pass-through circuit (13, 14) with threshold action, whose sources are interconnected and form the control input of the passthrough circuit (13, 14) with threshold action, and whose drains are interconnected and form the output (17) of the pass-through circuit with threshold action.

* * * * *